United States Patent
Sato et al.

(10) Patent No.: US 6,884,364 B2
(45) Date of Patent: Apr. 26, 2005

(54) LEAD-FREE PIEZOELECTRIC CERAMIC COMPOSITION WHERIN CU IS CONTAINED IN $(K_XA_{1-X})_Y(NB_{1-Z}B_Z)O_3$ PEROVSKITE COMPOUND, AND PROCESS OF PREPARING THE SAME

(75) Inventors: Fuyutoshi Sato, Nagoya (JP); Shin-ichi Hirano, Chita-gun (JP); Masato Matsubara, Nagoya (JP); Wataru Sakamoto, Nagoya (JP); Toshinobu Yogo, Nagoya (JP); Koichi Kikuta, Toyoake (JP)

(73) Assignees: Noritake Co., Limited, Nagoya (JP); Nagoya Industrial Science Research Institute, Nagoya (JP)

( * ) Notice: Subject to any disclaimer, the term of this patent is extended or adjusted under 35 U.S.C. 154(b) by 0 days.

(21) Appl. No.: 10/668,004

(22) Filed: Sep. 23, 2003

(65) Prior Publication Data

US 2004/0127344 A1 Jul. 1, 2004

(30) Foreign Application Priority Data

Sep. 24, 2002 (JP) ........................................ 2002-278207

(51) Int. Cl.$^7$ ...................... C04B 35/495; H01L 41/187
(52) U.S. Cl. ................................ 252/62.9 R; 501/134
(58) Field of Search ....................... 252/62.9 R; 501/134

(56) References Cited

U.S. PATENT DOCUMENTS 6,387,295 B1 * 5/2002 Saito .................... 252/62.9 R

FOREIGN PATENT DOCUMENTS

JP         A 2000-313664       11/2000

OTHER PUBLICATIONS

OM. Matubara., W. Sakamoto, T. Yogo and S. Hirano, "Fabriction and characterization of lead–free $K_xNa_t–Xnb_yTa_{1-y}O3$ piezoelectric ceramics", Mar. 24, 2002, 2 pgs, Preprints of Annual Meeting of The Ceramic Sociey of Japan, 2000.

* cited by examiner

Primary Examiner—C. Melissa Koslow
(74) Attorney, Agent, or Firm—Oliff & Berridge, PLC (57) ABSTRACT

A lead-free piezoelectric ceramic composition wherein a suitable amount of Cu is contained in a perovskite compound of a non-stoichiometric composition represented by a formula $(K_xA_{1-x})_y(Nb_{1-z}B_z)O_3$, wherein "A" represents at least one of Na and Bi, while "B" represents at least one of Ta and Ti, and wherein $0<x\leq1$, $0<y<1$, and $0\leq z\leq1$, so that by-products such as $K_aCu_bNb_cO_d$ and $K_aCu_bTa_cO_d$ are produced as a result of reaction of $(Nb_{1-z}B_z)$ with Cu in the process of calcination of a starting material, and the by-products restrict melting and abnormal grain growth of $(K_xNa_{1-x})(Nb_{1-z}Ta_z)$ $O_3$ during firing of a calcined body, thereby improving sinterability of the fired body, while restricting volatilization of alkali components and melting of $KNbO_3$, thereby increasing the density and improving the piezoelectric properties of the fired body. The ceramic composition is prepared by firing a starting composition including the perovskite composition as a primary component, and a secondary component in the form of at least one of compounds $K_aCu_bNb_cO_d$, $K_eCu_fTa_gO_h$ and $K_iCu_jTi_kO_l$.

14 Claims, 8 Drawing Sheets

LEAD-FREE PIEZOELECTRIC CERAMIC COMPOSITION WHERIN CU IS CONTAINED IN $(K_xA_{1-x})_y(NB_{1-z}B_z)$ $O_3$PEROVSKITE COMPOUND, AND PROCESS OF PREPARING THE SAME

This application is based on Japanese Patent Application No. 2002-278207 filed Sep. 24, 2002, the contents of which are incorporated hereinto by reference.

BACKGROUND OF THE INVENTION

1. Field of the Invention

The present invention relates to an improvement of lead-free piezoelectric ceramics.

2. Discussion of Related Art

Piezoelectric ceramics are used in various fields of technology, as a material for filters, actuators, transducers and any other devices capable of converting an electric energy (electric signal) directly into a mechanical energy (mechanical signal). At present, a perovskite compound containing lead is the most commonly used piezoelectric ceramic material. A typical example of such a perovskite compound is lead zirconate titanate ($Pb(Zr, Ti)O_3$). However, the lead zirconate titanate has a problem of environmental pollution caused by manufacture and disposal of a device using this piezoelectric ceramic material, since lead (PbO, in particular) contained in the lead zirconate titanate is harmful. In view of this problem, it has been proposed to use potassium sodium niobate (($K, Na)NbO_3$) and other lead-free piezoelectric ceramics represented by $ANbO_3$, where "A" represents an alkali metal. An example of the lead-free piezoelectric ceramics is disclosed in JP-A-2000-313664.

Generally, lead-free piezoelectric materials are inferior to lead-containing piezoelectric materials in the piezoelectric properties such as electromechanical coupling factor and mechanical quality factor. Of the lead-free piezoelectric materials, $(K, Na)NbO_3$, for example, has comparatively excellent piezoelectric properties, but is relatively hard to be sintered, so that formation of a highly dense structure of $(K, Na)NbO_3$ having excellent piezoelectric properties requires a hot pressing process, which is disadvantageous in the cost and efficiency of manufacture of the desired device, and in the freedom of design of the configuration and size of the structure. The low degree of sinterability of $(K, Na)NbO_3$ is due to a high degree of volatility of alkali metal components (K, Na) and a low melting point of $KNbO_3$, which tend to cause abnormal growth of grains and make it difficult to raise the firing temperature to a level high enough to assure high densification of the structure.

The lead-free piezoelectric material $ANbO_3$ disclosed in the above-indicated publication JP-A-2000-313664 contains one of Cu, Li and Ta as an additive to increase the sinterability and thereby improve the piezoelectric properties. Where a compound including one of those elements is added to or contained as a solid solution in the lead-free piezoelectric material in a trace amount, the element acts as a sintering agent to improve the sinterability. However, an experimentation described in the above-identified publication demonstrated that the addition of Cu to the piezoelectric material disclosed in the publication to improve the sinterability undesirably resulted in a reduction of the dielectric constant ε, and the addition of Li or Ta undesirably resulted in reductions in the electromechanical coupling factor kp and Curie point. Further, an experimentation conducted by the present inventors confirmed that the addition of Cu (e.g., in the form of CuO) resulted in substantially no improvement in the sinterability.

SUMMARY OF THE INVENTION

The present invention was made in view of the background art discussed above. It is a first object of the present invention to provide a lead-free piezoelectric ceramic composition capable of exhibiting excellent piezoelectric properties and having a high degree of efficiency of preparation or fabrication. A second object of the invention is to provide a process of preparing such a lead-free piezoelectric ceramic composition.

The first object indicated above may be achieved according to a first aspect of the present invention, which provides a lead-free piezoelectric ceramic composition wherein Cu is contained in the form of a solid solution in a crystal structure or at its grain boundary of a perovskite compound of a non-stoichiometric composition represented by a formula $(K_xA_{1-x})_y(Nb_{1-z}, B_z)O_3$, such as $K_4CuNb_8O_{23}$, $K_5Cu_2Nb_{11}O_{30}$ and $K_{5.4}Cu_{1.3}Ta_{10}O_{29}$, wherein "A" represents at least one of Na and Bi, while "B" represents at least one of Ta and Ti, and wherein $0<x\leq 1$, $0<y<1$, and $0\leq z\leq 1$.

In the lead-free piezoelectric composition of the present invention described above, a total content of the elements $Nb_{1-z}B_z$ in a site B of the perovskite compound is larger than a total content of the elements $K_xA_{1-x}$ in a site A of the perovskite compound, by an amount determined by "y" (A/B site ratio smaller than 1)=total content in the site A/total content in the site B, so that by-products such as $K_aCu_bNb_cO_d$, $K_eCu_fTa_gO_h$ and $K_iCu_jTi_kO_l$ (wherein "a" through "l" are arbitrary numerical values) are produced as a result of reaction of the elements in the site B with Cu, in the process of firing of the perovskite compound. The produced by-products serve to restrict melting and grain growth of thereby promoting the sinterability of the perovskite compound at a sintering or firing temperature in a range in which the amount of volatilization of alkali components is sufficiently small. In particular, partial substitution of Nb by Ta reduces the total content of $(K_xA_{1-x})NbO_3$ having a comparatively low melting point, thereby raising the melting point of the system as a whole, thus making it possible to raise the firing temperature to a level at which the volatilization of the alkali components does not matter, so that the sinterability of the perovskite compound can be further improved. Namely, the present lead-free piezoelectric ceramic composition can be well sintered in a normal manner, without employing a special forming and firing process such as a hot pressing process. The thus improved sinterability results in intended densification of the sintered body, and the above-indicated by-products desirably serve to enhance the piezoelectric properties of the sintered body. In particular, the partial substitution of Nb by Ta results in a considerable improvement of the dielectric constant of the sintered body. Thus, the present lead-free piezoelectric ceramic composition exhibits excellent piezoelectric properties and has a high degree of efficiency of preparation or fabrication.

Although the above-indicated publication JP-A-2000-313664 describes that the addition of Cu in the form of a solid solution to the perovskite compound improves its sinterability, the present inventors obtained a finding that an improvement of the sinterability owing to the by-products indicated above is available only in the case where the ratio of the elements in the site B is higher than the stoichiometric ratio. The present invention was made based on this finding.

In a first preferred form of the lead-free piezoelectric ceramic composition of the first aspect of this invention, 0.2–1.0 at. % of Cu is contained in the whole amount of the perovskite compound. In the present piezoelectric ceramic composition wherein at least 0.2 at. % of Cu is added to the whole amount of the perovskite compound, the above-indicated by-products are produced in a sufficiently large amount, so that the sinterability of the perovskite compound is improved to an accordingly large extent. Further, the largest at. % of Cu contained in the whole amount of the perovskite compound is 1.0 at. %, so that the amount of a liquid phase of the composition is limited so as to assure a high density of a sintered body of the composition. In one advantageous arrangement of the above-indicated first preferred form of the composition, at least 0.4 at. % of Cu is contained in the whole amount of the perovskite compound. In another advantageous arrangement, no more than 0.8 at. % of Cu is contained in the whole amount of the perovskite compound.

In a second preferred form of the lead-free piezoelectric composition, a value "y" in the formula of the perovskite compound is at least 0.9. In this case, the amount by which the total content of the elements Nb, Ta, Ti, etc. in the site B is larger than the elements in the site A, that is, the amount of deviation of the total content of the elements in the site B from the stoichiometric value is suitably limited, to prevent or minimize deterioration of the piezoelectric properties of the perovskite compound due to an excessively large amount of production of the above-indicated by-products. More preferably, the value "y" is at least 0.9 but is less than 0.99.

In a third preferred form of the lead-free piezoelectric ceramic composition, at least 0.2 at. % of Cu is contained in the whole amount of the perovskite compound, and a value "y" in the formula of the perovskite compound is less than 0.99. In this case, the amount of the B site ions is larger than the amount of the A site ions by at least 1 mol %, and at least 0.2 at. % of Cu is added to the perovskite compound, so that the mechanical quality factor Qm is significantly improved, and the dielectric loss tan δ is effectively reduced.

The amount of the by-products indicated above can be controlled by adjusting the content of Cu and the value "y" which determines the amount of the B site ions. The electromechanical coupling factor kp of the perovskite compound can be increased by reducing the amount of the by-products to be produced, and the mechanical quality factor Qm of the perovskite compound can be increased by increasing the amount of the by-products.

In a fourth preferred form of the lead-free piezoelectric ceramic composition, a value "z" in the formula of the perovskite compound is no more than 0.4. In this case, the electromechanical coupling factor and other piezoelectric properties of the piezoelectric ceramic composition will not be deteriorated due to an excessively large amount of Ta, for example. Although the substitution of Nb by Ta, for example improves the sinterability and the dielectric constant of the piezoelectric ceramic composition, the substitution tends to deteriorate the other piezoelectric properties. While it is desirable to maximize the value "z" where the piezoelectric properties other than the dielectric constant are not so important, it is desirable to limit the value "z" to an extent possible to assure a sufficient improvement of the sinterability, where the above-indicated other piezoelectric properties are also important.

The electric properties of the piezoelectric ceramic composition can be adjusted as desired by adjusting the value "z" in the above-indicated formula, that is, the amount of solid solution of $KTaO_3$, as well as the amount of solid solution of Cu and the value "y" (which determines the amount of the B site ions). That is, it is possible to obtain the piezoelectric ceramic composition having the desired electric properties that meet a device to be manufactured.

In a fifth preferred form of the lead-free piezoelectric ceramic composition of the present invention, Cu is contained in said perovskite compound, in the form of at least one of compounds $K_aCu_bNb_cO_d$, $K_eCu_fTa_gO_h$ and $K_iCu_jTi_kO_l$, wherein "a" through "l" are arbitrary numerical values. These compounds including Cu are effective to restrict melting and abnormal grain growth of $(K, A)NbO_3$, thereby improving the sinterability of the perovskite compound, when at least one of those Cu compounds is produced in an initial period of the firing process, or added to the perovskite compound.

In a sixth preferred form of the lead-free piezoelectric ceramic composition of this invention, a value "x" in the formula of the perovskite compound is equal to 0.5, that is, the perovskite compound is represented by $(K_{0.5}A_{0.5})_y(Nb_{1-z}B_z)O_3$. The perovskite compound $(K, A)(Nb, B)O_3$ has a tendency that the sinterability decreases with an increase in the ratio of K, while the piezoelectric properties are deteriorated with an increase in the ratio of A, that is, Na or Bi. In view of this, the value "x" in the formula is suitably selected. Generally, the perovskite compound is satisfactory in both of the sinterability and the piezoelectric properties, when the value "x" is about 0.5.

The second object indicated above may be achieved according to a second aspect of this invention, which provides a process of preparing a lead-free piezoelectric ceramic composition, comprising the steps of:

preparing a starting composition including, as a primary component, a perovskite compound represented by a formula $(K_xA_{1-x})(Nb_{1-z}B_z)O_3$, wherein "A" represents at least one of Na and Bi, while "B" represents at least one of Ta and Ti, and wherein $0<x\leq1$, and $0<z<1$, and as a secondary component, at least one of compounds $K_aCu_bNb_cO_d$, $K_eCu_fTa_gO_h$ and $K_iCu_jTi_kO_l$, such as $K_4CuNb_8O_{23}$, $K_{5.4}Cu_{1.3}Ta_{10}O_{39}$, wherein "a" through "l" are arbitrary numerical values; and subjecting the starting composition to a firing treatment.

In the process of preparing a lead-free piezoelectric ceramic composition according to the second aspect of the present invention, the secondary component included in the starting composition acts to restrict melting and grain growth of $(K_xA_{1-x})(Nb_{1-z}B_z)O_3$ and thereby improve the sinterability of the starting material, so that the perovskite compound has a high degree of sinterability at a firing temperature in a range in which the volatilization of alkali components does not matter. In particular, partial substitution of Nb by Ta reduces the total content of $(K_xA_{1-x})NbO_3$ having a comparatively low melting point, thereby raising the melting point of the system as a whole, thus making it possible to raise the firing temperature to a level at which the volatilization of the alkali components does not matter, so that the sinterability of the perovskite compound can be further improved. Namely, the perovskite compound composition can be well sintered in a normal manner, without employing a special forming and firing process such as a hot pressing process. The thus improved sinterability results in intended densification of a sintered body of the piezoelectric ceramic composition, and the above-indicated by-products owing to the secondary component desirably serve to enhance the piezoelectric properties of the sintered body. In particular, the partial substitution of Nb by Ta results in a considerable improvement of the dielectric constant of the sintered body. Thus, the lead-free piezoelectric ceramic composition prepared according to the present process exhibits excellent piezoelectric properties and has a high degree of efficiency of preparation or fabrication.

The second object may also be achieved according to a third aspect of this invention, which provides a process of preparing a lead-free piezoelectric composition, comprising the steps of: preparing a first starting material in the form of a perovskite compound of a non-stoichiometric composition represented by a formula $(K_xA_{1-x})_y(Nb_{1-z},B_z)O_3$, wherein "A" represents at least one of Na and Bi, while "B" represents at least one of Ta and Ti, and wherein $0<x\leq 1$, $0<y<1$ and $0\leq z\leq 1$, a second starting material serving as a source of Cu, and calcining the mixture. In this form of the process, the site B ions the amount of which is larger than that of the site A ions react with Cu, so that the above-indicated by-products are produced. Thus, the mere step of mixing the first starting material for the perovskite compound and the second starting material as the source of Cu permits easy preparation of the lead-free piezoelectric ceramic composition having a high degree of sinterability and exhibiting excellent piezoelectric properties. Preferably, the second starting material is CuO.

In one preferred form of the process of the invention, the secondary component includes one of $K_4CuNb_8O_{23}$ and $K_5Cu_2Nb_{11}O_{30}$, which is to be added to the primary component.

For improving the density of a sintered body of a piezoelectric ceramic composition, it has been proposed to add various additives to the perovskite compound. Such additives include those for restricting the grain growth of the system to thereby improve the sinterability of the sintered body, and those which have a relatively low melting point and act to produce a liquid phase to thereby promote the sintering of the perovskite compound. The principle of the present invention employs the former, that is, the secondary component in the form of at least one compound including Cu, which secondary component produces the above-indicated by-products in the process of the firing operation, so that the sinterability of the perovskite compound is improved by the by-products.

In the present invention, Cu may be contained in a suitable form in the perovskite compound, for instance, in the form of a solid solution in a crystal structure of the perovskite compound, or present at its crystal grain boundary. Cu may be contained in only one form or in two or more different forms in the perovskite compound.

BRIEF DESCRIPTION OF THE DRAWINGS

The above and other objects, features, advantages and technical and industrial significance of the present invention will be better understood by reading the following detailed description of preferred examples of the invention, when considered in connection with the accompanying drawings, in which.

DETAILED DESCRIPTION OF THE PREFERRED EMBODIMENT

There will be described in detail one embodiment of this invention, referring to the accompanying drawings.

Figure 1:
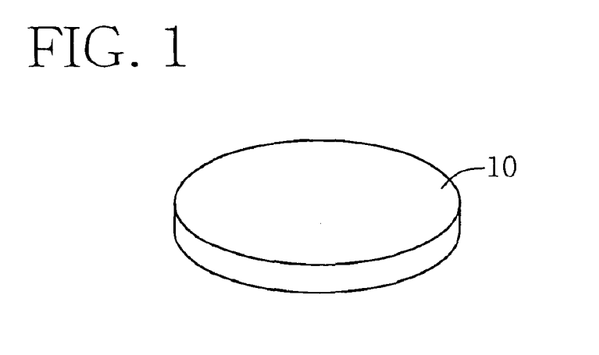
FIG. 1 is a perspective view of a piezoelectric ceramic element according to one embodiment of this invention.

Referring first to the perspective view of FIG. 1, there is illustrated a piezoelectric ceramic element 10 (hereinafter referred to as "element 10") formed of a lead-free piezoelectric ceramic composition. The element 10 takes the form of a circular disc having a substantially constant diameter of about 20 mm and a substantially constant thickness of about 1 mm. For instance, the element 10 is used for a supersonic or ultrasonic actuator.

The lead-free piezoelectric ceramic composition of the element 10 is constituted primarily by a lead-free perovskite compound $(K,Na)(Nb,Ta)O_3$, for example, $(K_{0.5}Na_{0.5})_{0.97}(Nb_{0.9}Ta_{0.1})O_3$. At the grain boundary of $(K, Na)(Nb, Ta)O_3$, there exists at least one compound including Cu, such as $K_aCu_bNb_cO_d$, for instance, $K_4CuNb_8O_{23}$ and $K_5Cu_2Nb_{11}O_{30}$, and/or $K_eCu_fNb_gO_h$, for instance, $K_{5.4}Cu_{1.3}Ta_{10}O_{29}$, wherein "a" through "h" are arbitrary numerical values. The element 10 is a dense piezoelectric structure having a density of about $4.4(g \cdot cm^{-3})$ and a relative density of about 98%, for example, and excellent piezoelectric properties such as an electromechanical coupling factor kp of about 40%, a mechanical quality factor Qm of about 1500, a dielectric constant of about 200–300 and a dielectric loss tan δ of about not higher than 0.004.

The element 10 is manufactured in a manner similar to that of a conventional piezoelectric element, except for the manner of preparation of a starting composition. There will be described a process of manufacturing the element 10.

To prepare the starting composition, there are prepared starting materials in the form of $KHCO_3$ (or $K_2CO_3$), NaHCO$_3$ (or Na$_2$CO$_3$), Nb$_2$O$_5$, Ta$_2$O$_5$, CuO, etc. The amounts of these starting materials are determined to provide a basic composition represented by a formula (K$_x$Na$_{1-x}$)$_y$(Nb$_{1-z}$Ta$_z$)O$_3$ (wherein 0 <x ≦1, 0.9 <y<1, and 0≦z ≦0.4), and 0.2–1.0 at.% (Cu-equivalent amount) of a compound CuO. Namely, the amounts of the starting materials are determined to provide a perovskite compound represented by ABO$_3$, such that the amount of site B ions is larger than that of site A ions. Described in detail, values "x", "y" and "z" in the above-indicated formula and the amount of CuO are determined so that a sintered body of a lead-free piezoelectric composition prepared from the stating composition exhibits the desired properties, as described below. Then, the starting materials are introduced into a suitable mixer such as a pot mixer, and mixed together for about 24 hours, in a wet-mixing fashion with ethanol used as a disperse medium. Subsequently, a mass of a mixture thus obtained as the starting composition is calcined in an atmosphere, such that the mass is held at a highest temperature of about 900° C. for about 5 hours. The uniformity of the composition of the calcined mass can be improved by repeating the mixing and calcining steps indicated above. Then, the calcined mass is dried at about 100° C. for about 24 hours. The dried mass is passed through a sieve of about #100 mesh, so that a calcined powder of the starting composition is obtained. In the calcining process, the compound CuO added to the perovskite compound reacts with the site B ions, and by-products such as K$_a$Cu$_b$Nb$_c$O$_d$ (e.g., K$_4$CuNb$_8$O$_{23}$) are produced as a result of the reaction.

Then, the calcined powder of the starting composition is molded into a cylindrical green body, under a pressure of about 200 MPa, by CIP (cold isostatic pressing), by using a suitable press equipped with a mold corresponding to the specific size and configuration of the element 10 to be formed, and under a pressing condition determined by the desired properties of the element 10 and the properties of the calcined powder. Alternatively, the calcined powder is initially molded by a press, and the thus green body is then subjected to cold isostatic pressing (CIP), to improve the uniformity of the formed body. The cylindrical green body is then fired at a maximum firing temperature of 1000–1150° C., to obtain a cylindrical sintered body of the lead-free piezoelectric ceramic composition. The cylindrical sintered body is cut by a diamond cutter, to obtain the element 10 having the desired diameter and thickness. The element 10 is ground on its opposite surfaces to improve the parallelism of those opposite surfaces, and is coated with a paste of Ag on the ground surfaces, which is then baked. Thus, the element 10 is processed into a desired piezoelectric body or structure.

In the firing step described above, the perovskite compound is produced by the calcined powder of the starting composition. In the firing process, the by-products produced in the calcining step function to restrict melting of the perovskite compound, and thereby restrict grain growth (abnormal growth of grains, in particular) of the perovskite compound. That is, the sintering of the perovskite compound takes place in the presence of substances at the crystal grain boundary such that the substances prevent the grain growth. As a result, the sintered body of the present piezoelectric ceramic composition is more densified than a sintered body of the conventional piezoelectric ceramic composition (K, Na)NbO$_3$, so that the element 10 exhibits excellent piezoelectric properties as described above.

In the lead-free piezoelectric composition according to the present embodiment of the invention, the proportion of the amounts of the individual starting materials of the starting composition is determined such that the total content of the elements Nb$_{1-z}$Ta$_z$ in the site B of the perovskite compound is larger than the total content of the elements K$_x$Na$_{1-x}$ in the site A of the perovskite compound, and the suitable amount of CuO is added to the perovskite compound, so that the by-products such as K$_a$Cu$_b$Nb$_c$O$_d$ and K$_e$Cu$_f$Ta$_g$O$_h$ are produced as a result of reaction of the elements in the site B with Cu, in the process of calcinations of the perovskite compound. The produced by-products serve to restrict melting and abnormal grain growth of (K$_x$Na$_{1-x}$)$_y$(Nb$_{1-z}$Ta$_z$)O$_3$ in the process of final firing of the perovskite compound, thereby promoting the sinterability of the perovskite compound, so that the undesirable volatilization of the alkali components and the melting of KNbO$_3$ are restricted, with a result of increasing the density of the sintered body or structure and thereby improving the piezoelectric properties of the sintered body. Further, partial substitution of Nb by Ta reduces the total content of (K$_x$Na$_{1-x}$)NbO$_3$ having a comparatively low melting point, thereby raising the melting point of the system as a whole, thus making it possible to raise the firing temperature to a level at which the volatilization of the alkali components does not matter, so that the sinterability of the perovskite compound can be further improved. Furthermore, such partial substitution of Nb by Ta restricts grain growth, thereby easily homogenizing microtexture of the perovskite compound or making it possible to keep microstructure of the perovskite compound under control.

To evaluate the properties of the lead-free piezoelectric ceramic composition of the present embodiment, experiments were conducted on various examples or specimens of the element 10 (sintered body) which were prepared with different combinations of the values "x", "y" and "z" in the above-identified formula (K$_x$Na$_{1-x}$)(Nb$_{1-z}$Ta$_z$)O$_3$ and the amount of addition of CuO. The conditions of preparation of the specimens are identical with those described above, unless otherwise specified. The evaluation of various electrical properties of the specimens was effected by: poling the specimens by application of an electric field of 3.0 kV/mm 30 minutes to the specimens immersed in a mass of a silicone oil kept at 100° C.; aging the specimens by holding them at the room temperature for 24 hours; and evaluating the electrical properties of the specimens, using an impedance analyzer, by a resonance/anti-resonance method according to EMAS-6100, Electrical Test of Piezoelectric Ceramic Transducer, Japan Electronic Material Industry Standard.

Figure 2:
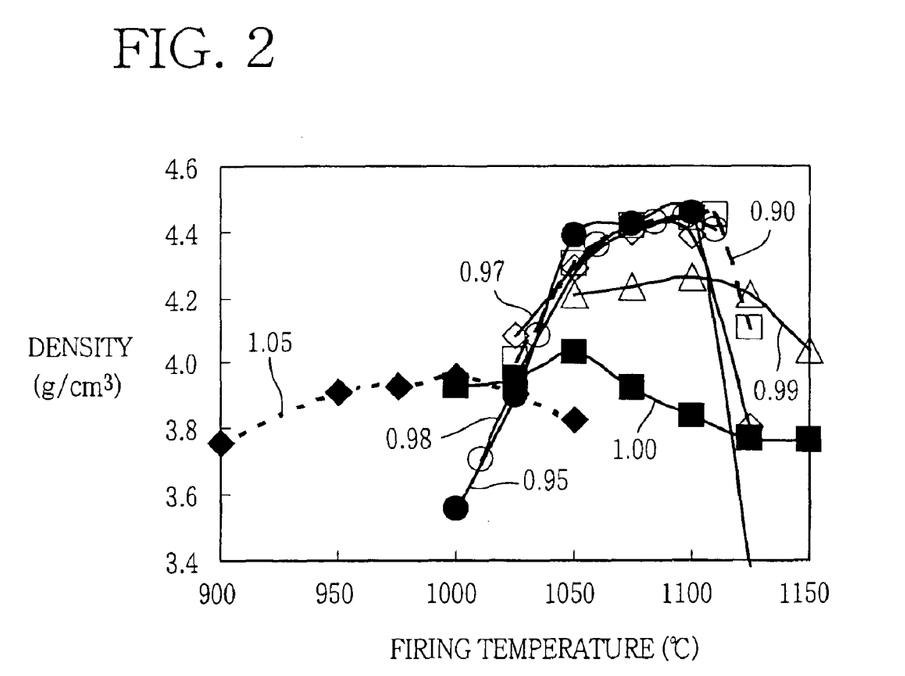
FIG. 2 is a graph indicating a relationship between a firing temperature and a density of a sintered body of the element, for each of various values of a ratio "y" (A/B site ratio)

The graph of FIG. 2 indicates a measured density of each of the sintered bodies fired at different temperatures, for each of the specimens having respective different values "y", namely, 1.05, 1.00, 0.99, 0.98, 0.97, 0.95, 0.90, each of which is the A/B site ratio=total amount of the site A ions/total amount of the site B ions. In the specimens evaluated, 0.2 wt. % of CuO was added, and the values "x" and "z" were 0.5 and 0, respectively. That is, 0.2 wt. % of CuO was added to 100 wt. % of the perovskite compound represented by (K$_{0.5}$Na$_{0.5}$)$_y$NbO$_3$. Curves in the graph of FIG. 2 correspond to the respective seven different values "y", 1.05, 1.00, 0.95, etc.

It will be understood from the graph of FIG. 2 that the highest density value of the sintered bodies where the value "y" is 1.00 and 1.05 was about 4.0 g/cm$^3$. That is, the density was not sufficiently high where the ratio of the site A ions was equal to or higher than the stoichiometric ratio. It will also be understood that the density was as high as 4.2 g/cm$^3$ or higher at suitably selected firing temperature values where the amount of the site B ions is larger than that of the site A ions. In particular, the density was improved to a level as high as 4.4 g/cm$^3$ where the value "y" was not larger than 0.98. In other words, it was confirmed that the sinterability of the sintered bodies of $(K_{0.5}Na_{0.5})NbO_3$ was significantly improved where the amount of the site B ions was made larger than that of the site A ions, together with the addition of CuO. It is noted that although the formed sintered bodies absorbed atmospheric water vapor and eventually experienced deliquescence, where the value "y" was 1.05 and 1.00, this deliquescence did not take place where the value "y" was smaller than 1.00.

Figure 3:
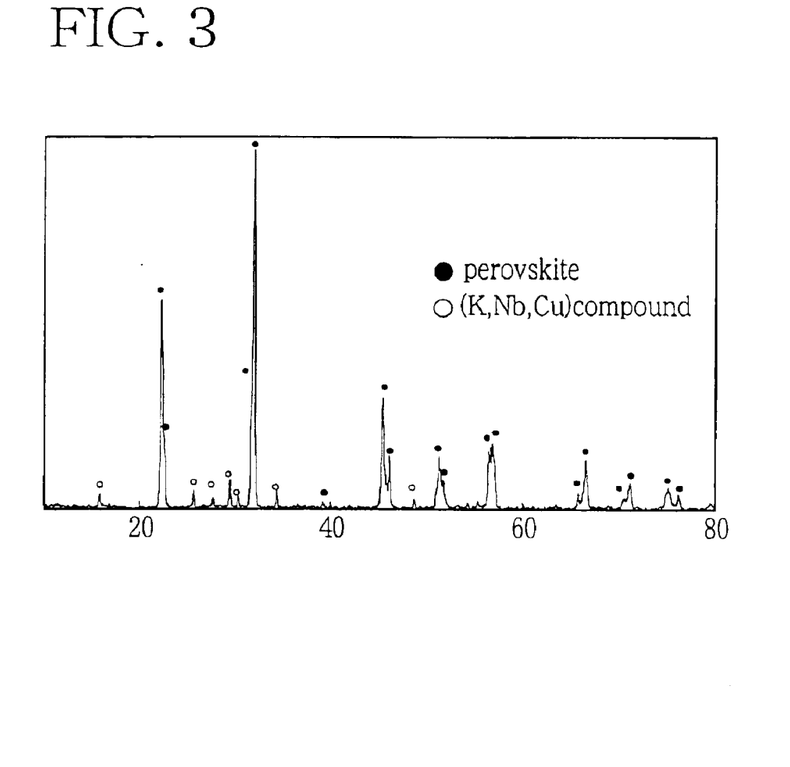
FIG. 3 is a view indicating an X-ray diffraction pattern of the sintered body.

The graph of FIG. 3 indicates an X-ray diffraction pattern of the sintered body where CuO was added such that 0.4 at. % of Cu was added to the whole amount of the perovskite compound, and where the value "y" was 0.90. In this specimen wherein the amount of the site B ions was larger than that of the site A ions, peaks of by-products in the form of compounds represented by (K, Nb, Cu), other than the perovskite compound, were recognized. Similar X-ray diffraction patterns (not shown) of the sintered bodies having the other values "y" smaller than 1.00 were confirmed. In the specimens having the values "y" of 1.00 (A/B site ratio equal to the stoichiometric ratio) and 1.05 (A/B site ratio higher than the stoichiometric ratio), only the peaks indicated by black dots in FIG. 3 were detected in the X-ray diffraction pattern. Namely, only the perovskite phase was recognized. Thus, it was confirmed that the addition of CuO in a suitable amount and the selection of the A/B site ratio at a value lower than 1.00 caused the production of by-products which contributed a significant increase in the density of the sintered bodies. This increase is considered to result from an improvement in the sinterability of the perovskite compound, which arises from the function of the by-products produced in the process of calcinations of the starting composition according to the present invention, namely, restriction of melting and grain growth of the perovskite compound in the process of final firing (sintering) of the calcined starting composition.

Figure 4:
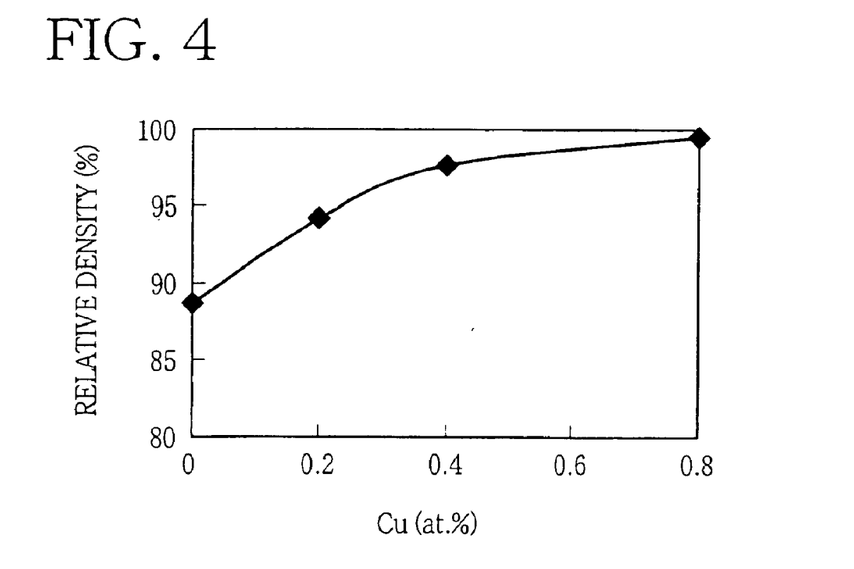
FIG. 4 is a graph indicating a relationship between an amount of addition of CuO and a relative density of the sintered body.

The graph of FIG. 4 indicates a relationship between the amount of addition of CuO and a measured relative density of the sintered body where the value "y" was 0.97. In this graph, at. % of Cu (Cu-equivalent amount of CuO) is taken along the abscissa, to indicate the amount of addition of CuO. It will be understood from the graph of FIG. 4 that the relative density was about 90% where the amount of addition of Cu was smaller than 0.2 at. %. While the specimens having the at. % of Cu lower than 0.2 exhibited an improvement in their properties as described below, the sintered bodies of these specimens suffered from collapsing due to deliquescence. It will also be understood that the relative density was raised to a value not lower than 98% and substantially no deliquescence was detected, where the Cu amount was 0.4 at. % or higher. Namely, where the value "y" is 0.97, the amount of addition of Cu is preferably 0.2 at. % or higher.

Figure 5:
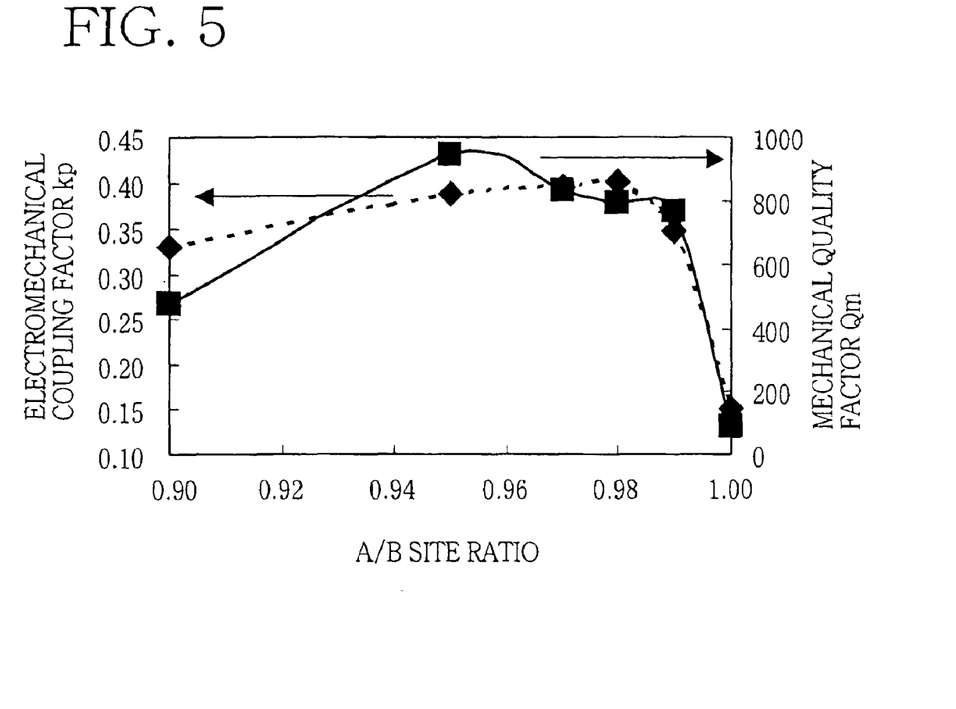
FIG. 5 is a graph indicating relationships of the A/B site ratio of the sintered body with respect to its electromechanical coupling factor and mechanical quality factor.
Figure 6:
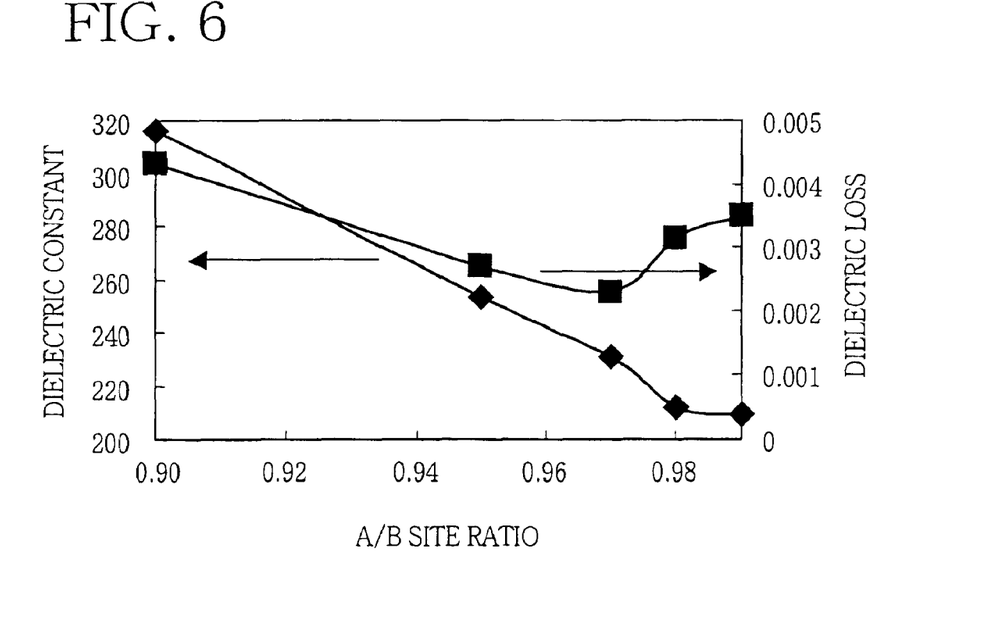
FIG. 6 is a graph indicating relationships of the A/B site ratio of the sintered body with respect to its dielectric constant and dielectric loss.

The graphs of FIGS. 5 and 6 indicate measured values of the piezoelectric properties of the sintered bodies in relation to the value "y" (A/B site ratio). The electric properties were evaluated by measuring the electromechanical coupling factor kp, mechanical quality factor Qm, dielectric constant ε and dielectric loss tan δ, where the amount of addition of Cu was 0.4 at. % at which the addition of CuO had a sufficiently large effect as shown in FIG. 4. It will be understood from the graph of FIG. 5 that the mechanical quality factor Qm and the electromechanical coupling factor kp had the highest values where the value "y" was 0.95 and 0.98, respectively, and that those factors Qm, kp had a tendency of decreasing with a decrease of the value "y" from those critical values.

It is speculated that while the above-indicated by-products which contribute to an improvement in the density of the sintered body will not adversely influence the electrical properties of the sintered body as long as the amount of the by-products is not excessively large, the by-products may deteriorate the electrical properties where the by-products are produced in an excessively large amount. It will also be understood from the graph of FIG. 6 that the dielectric constant ε has a tendency of increasing with a decrease of the value "y", while the dielectric loss tan δ had a tendency of increasing with a decrease of the value "y" from 0.97, although the dielectric loss at the value "y" between 0.97 and 1.00 was lower than that at the value "y" of 1.00. That is, it is not desirable to decrease the value "y" to such an extent as to cause a considerable increase in the dielectric loss.

The by-products indicated above may include, for instance, $K_aCu_bNb_cO_d$ (wherein $4 \leq a \leq 6$, $1 \leq b \leq 2$, $8 \leq c \leq 12$, and $20 \leq d \leq 35$), and $K_eCu_fTa_gO_h$ (wherein "e" through "h" are arbitrary numerical values), for example, $K_{5.4}Cu_{1.3}Ta_{10}O_{29}$). The graph of FIG. 7 indicates a relationship between the at. % of Cu and measured density values of the sintered bodies obtained by firing two kinds of calcined starting compositions one of which consists of $(K_{0.5}Na_{0.5})NbO_3$ and $K_4CuNb_8O_{23}$, and the other of which consists of $(K_{0.5}Na_{0.5})NbO_3$ and $K_5Cu_2Nb_{11}O_{30}$. It will be understood from the graph of FIG. 7 that the sintered body obtained from the starting composition including $K_4CuNb_8O_{23}$ which contains 0.5 at. % of Cu had a density of about 4.5 g/cm$^3$. That is, a lead-free piezoelectric ceramic composition (K, Na)NbO$_3$ having an improved degree of sinterability and exhibiting excellent properties can be obtained by adding the by-product KCuNbO (which would be produced where the value "y" is smaller than 1), even where the value "y" is equal to 1 (even where the perovskite compound is the stoichiometric composition), rather than by selecting the value "y" to be smaller than 1 and adding CuO to the perovskite composition. The density value of about 4.5 g/cm$^3$ corresponds to conversion of the entire amount of Cu into $K_4CuNb_8O_{23}$ where the value "y" (A/B site ratio) is 0.98 and where 0.5 at. % of Cu is added. In this respect, it is noted that where 0.4 at. % of CuO is added and the entire amount of Cu is converted into $K_4CuNb_8O_{23}$, the density will not be further increased with an increase of the value "y" from 0.984. Actually, however, high peak intensity in the X-ray diffraction pattern were obtained within the range of the value "y" between 0.98 and 0.9. It follows from this fact that it is considered that by-products other than $K_4CuNb_8O_{23}$ are produced.

Figure 8:
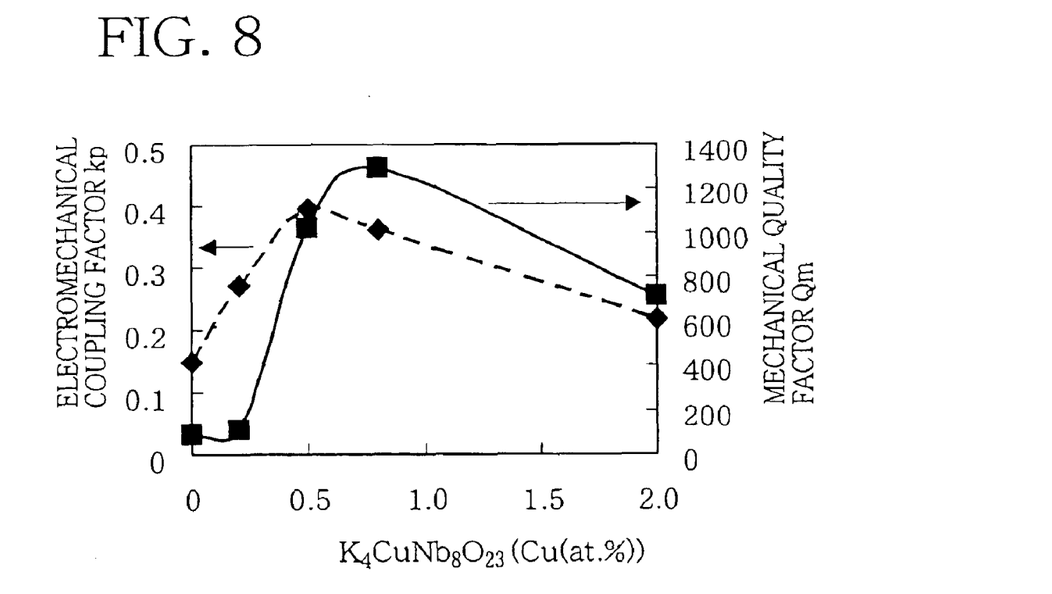
FIG. 8 is a graph indicating a relationship between an amount (Cu-equivalent amount) of addition of $K_4CuNb_8O_{23}$ and the piezoelectric properties of the sintered body.

The graph of FIG. 8 indicates the piezoelectric properties in relation to the at. % (Cu-equivalent amount) of $K_4CuNb_8O_{23}$ added. The electromechanical coupling factor kp had the largest value where 0.5 at. % (Cu-equivalent amount) of $K_4CuNb_8O_{23}$ was added. This fact is consistent with the fact that the largest value of the electromechanical coupling factor kp was obtained by an amount of the compound (K, Cu, Nb) produced when the value "y" (A/B site ratio) was around 0.98, as indicated in the graph of FIG. 5. Where the value "y" is 0.90, the amount of addition of CuO must be 2.5 at. % or more in order to convert the entire amount of an excess of the B site ions into $K_4CuNb_8O_{23}$. In the specific example shown in the graph of FIG. 4 wherein the amount of addition of CuO is 0.4 at. %, the amount of the site B ions is still larger than that of the site A ions.

Figure 7:
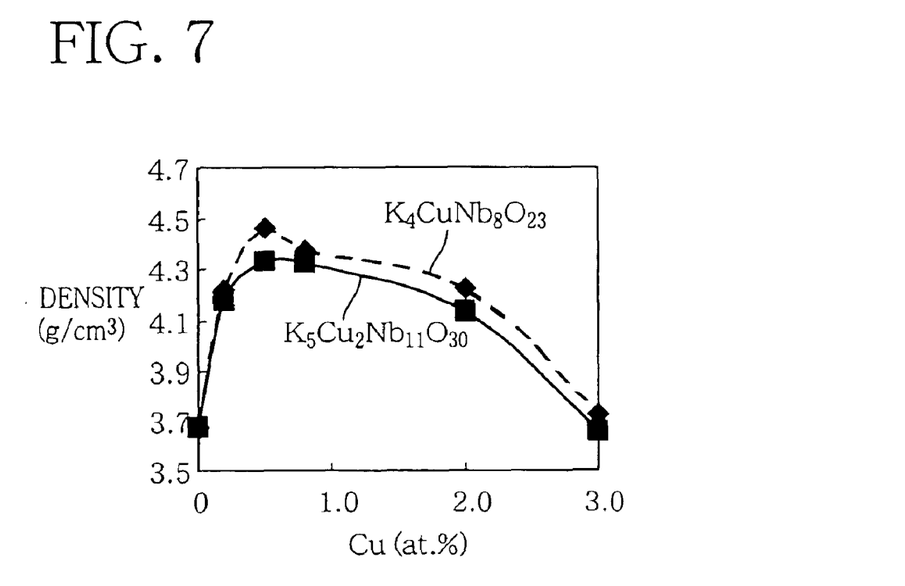
FIG. 7 is a graph indicating a relationship between an amount (Cu-equivalent amount) of direct addition of a by-product and the density of the sintered body.

The graph of FIG. 7 indicates that the density was considerably low when $K_4CuNb_8O_{23}$ was added such that the amount of addition of Cu was 2.0 at. % or more.

Figure 11:
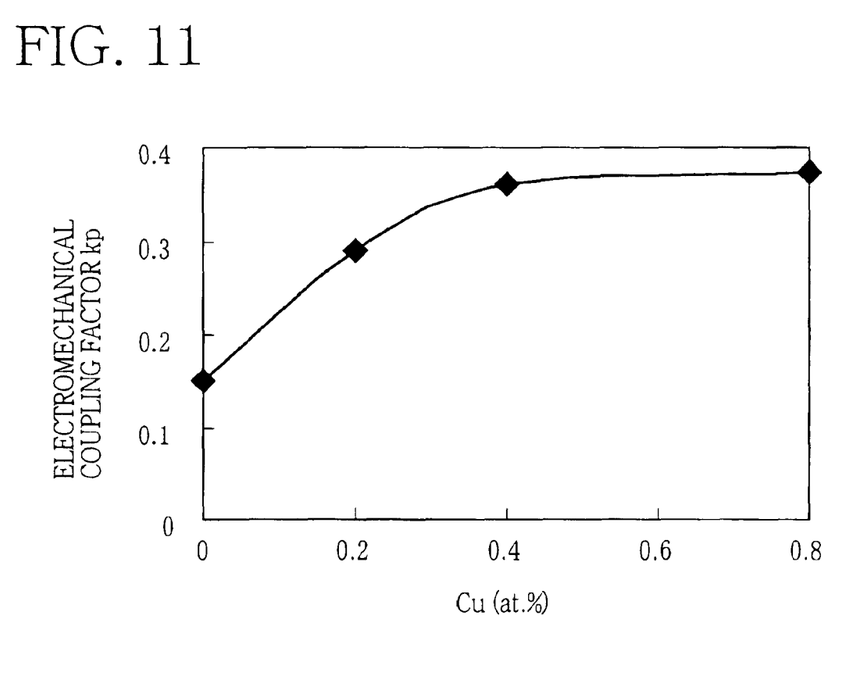
FIG. 11 is a graph indicating a relationship between the amount (Cu-equivalent amount) of addition of CuO and the electromechanical coupling factor of the sintered body.

However, the graph of FIG. 2 indicates that the density values of the specimens corresponding to the value "y" of 0.90 were not so low. This means that the B site ions did not adversely influence the sinterability of the sintered bodies. The graph of FIG. 11 indicates that the addition of CuO where the value "y" is 0.97 caused a considerable increase in the electromechanical coupling factor kp, and the graph of FIG. 8 indicates that the addition of $K_4CuNb_8O_{23}$ caused an increase in the mechanical quality factor Qm to 1000 or higher. Accordingly, it is clear that the by-products produced as a reaction of CuO with the site B elements contributed to a significant increase of the mechanical quality factor Qm, where the A/B site ratio (value "y") is smaller than 1.00.

It was also confirmed that the peak intensity in the X-ray diffraction pattern increased with a decrease of the A/B site ratio (value "y") from 0.98. This aspect is not shown in the drawings. Accordingly, it is speculated that various compounds $K_aCu_bNb_cO_d$ other than $K_4CuNb_8O_{23}$ are produced, and that these other compounds contribute to an improvement in the density of the system, like the compound $K_4CuNb_8O_{23}$. These compounds have a dielectric constant $\epsilon$ of about 300 almost equal to or slightly smaller than that of a piezoelectric ceramic composition whose major component is $(K, Na)Nb_3$. Further, the total amount of those compounds contained in the sintered body is not so large as to cause concentration of the electric field on the by-products during the poling treatment of the sintered body, which concentration would deteriorate the electrical properties of the sintered body. In other words, the improvement of the density of the sintered body owing to the above-indicated compounds provides a considerable improvement in the piezoelectric properties of the sintered body, without an adverse influence of those compounds.

As indicated in the graphs of FIGS. 7 and 8, an increase in the total amount of the by-products due to an increase in the amount of addition of Cu over 0.8 at. % caused a decrease in the density and also a decrease in the electromechanical coupling factor kp and the mechanical quality factor Qm. Namely, it is considered that the addition of Cu in an excessively large amount causes the by-products to disturb the sintering of the perovskite compound. It is noted that the addition of $K_aCu_bTa_cO_d$ such as $K_{5.4}Cu_{1.3}Ta_{10}O_{29}$ or the addition of $K_eCu_fTi_g O_h$, in place of $K_aCu_bNb_cO_d$ are also effective to improve the density of the sintered body.

Figure 9:
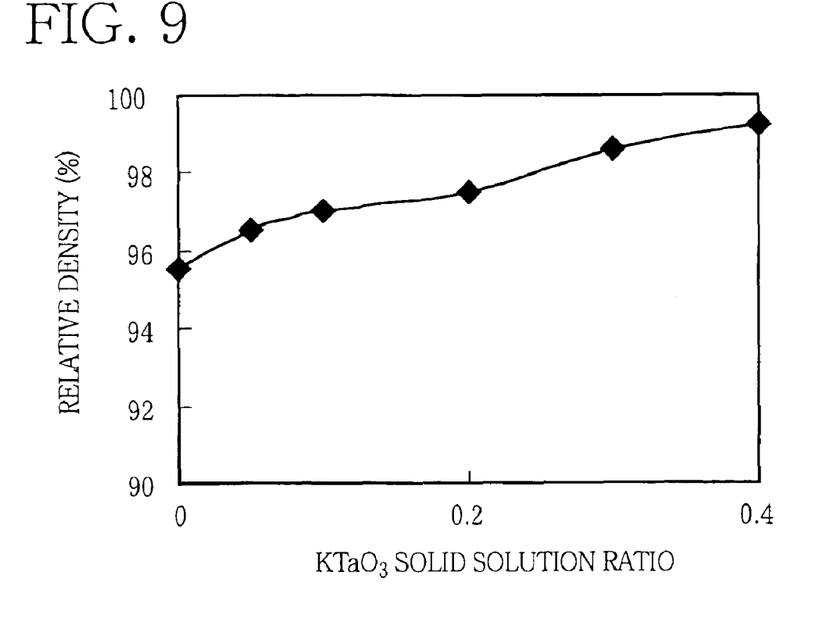
FIG. 9 is a graph indicating a relationship between a solid solution ratio of $KTaO_3$ and the relative density of the sintered body.
Figure 10:
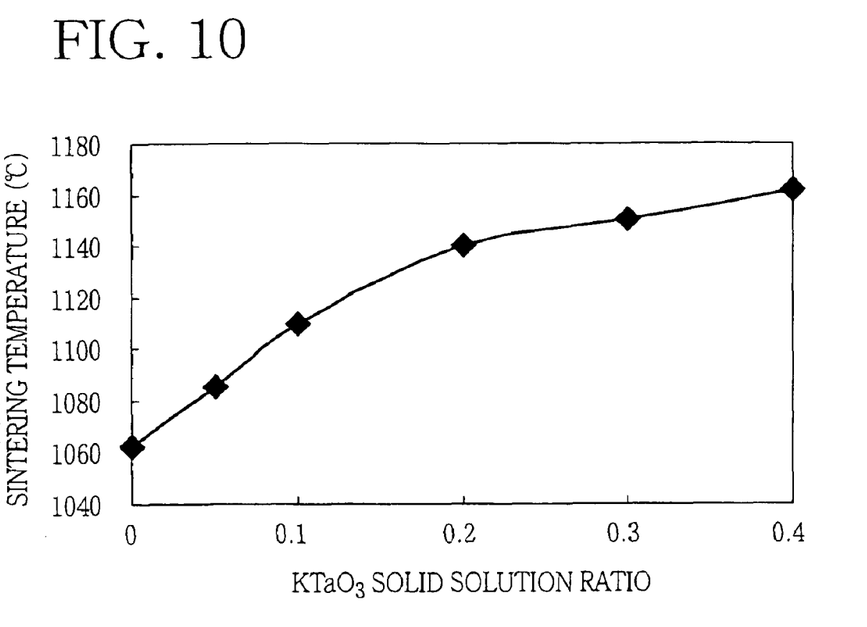
FIG. 10 is a graph indicating a relationship between the solid solution ratio of $KTaO_3$ and an optimum sintering temperature of the sintered body.

The graphs of FIGS. 9 and 10 indicate measured values of the piezoelectric properties in relation to the amount of solid solution of $KTaO_3$ further included in the perovskite compound. In these graphs, the solid solution ratio (molar ratio) of $KTaO_3$ taken along the abscissa corresponds the value "z" in the formula $(K_{0.5}Na_{0.5})_{0.99}(Nb_{1-z}Ta_z)O_3$. That is, the solid solution ratio of $KTaO_3$ taken along the abscissa is a ratio where the entirety of the solid solution corresponds to the ratio of 1. It will be understood from the graphs of FIGS. 9 and 10 that the optimum sintering temperature and the density of the sintered bodies had a tendency of increasing with an increase in the solid solution ratio of $KTaO_3$. Thus, it was confirmed that the solid solution of $KTaO_3$ was effective to improve the sinterability of the piezoelectric ceramic composition. The optimum sintering temperature indicated in FIG. 10 is a firing temperature at which the highest relative density is obtained at each of the solid solution ratios of $KTaO_3$. The relative density indicated in FIG. 9 is a value when the firing was effected at the optimum sintering temperature, for each of the specimens having the different solid solution ratios of $KTaO_3$. The graphs of FIGS. 9 and 10 indicate that the solid solution of $KTaO_3$ has an effect of raising the melting point of the system as a whole, and thereby permitting the optimum sintering temperature at which the system has the highest degree of sinterability.

Figure 12:
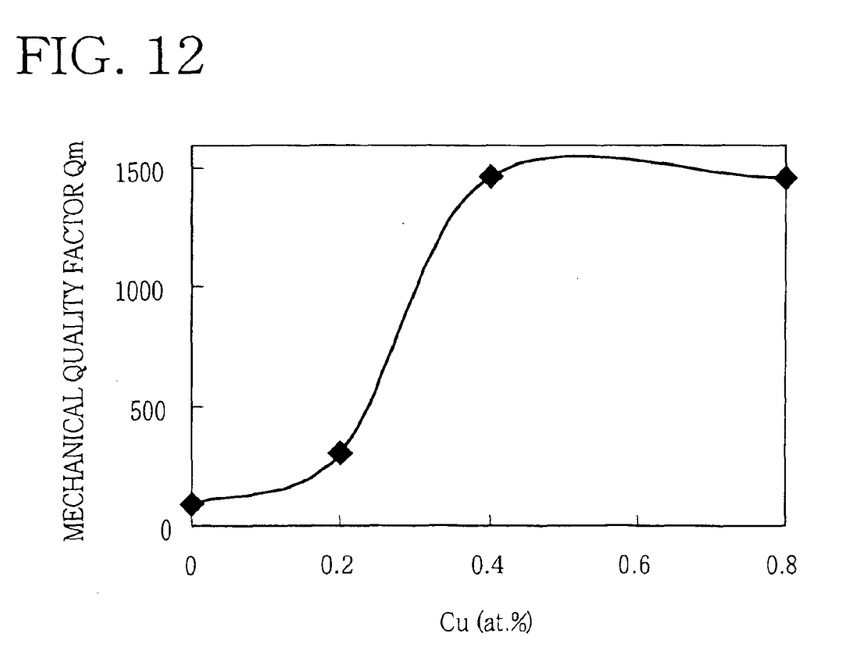
FIG. 12 is a graph indicating a relationship between the amount (Cu-equivalent amount) of addition of CuO and the mechanical quality factor of the sintered body.

While impurities included in a composition generally have an adverse influence on the electric properties of the composition, the above-indicated by-products had an effect of improving the electric properties of the system. The graphs of FIGS. 11 and 12 indicate the electromechanical coupling factor kp and the mechanical quality factor Qm, which were measured when the amount of addition of CuO to the compound $(K_{0.5}Na_{0.5})_{0.97}NbO_3$ was changed from zero to 0.4 wt. %. Changes of the factors kp and Qm with the amount of CuO addition are consistent with an improvement of the sinterability of the system, that is, with an increase in the relative density with an increase in the amount of Cu addition (at. %), which is indicated in the graph of FIG. 4. In particular, the mechanical quality factor Qm was considerably increased when CuO was added such that the amount of Cu addition exceeded 0.2 at. %, and was higher than 1000 when the amount of Cu addition was 0.4 at. % or higher. Further, the same system exhibited an extremely small dielectric loss of 0.1% or lower, but a relatively low dielectric constant of about 200–300. The dielectric loss and the dielectric constant of the system are not shown in the drawings.

Figure 13:
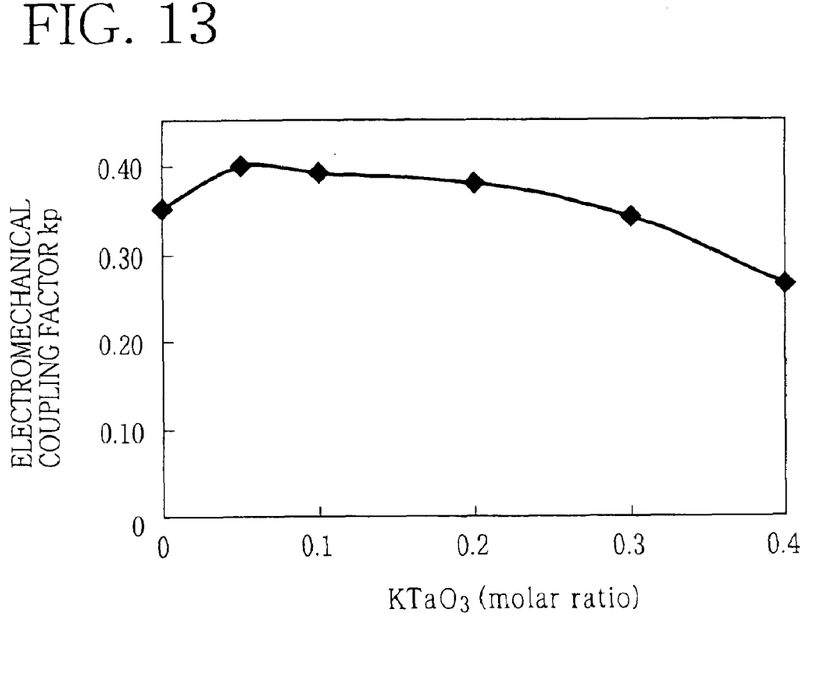
FIG. 13 is a graph indicating a relationship between the solid solution ratio of $KTaO_3$ and the electromechanical coupling factor of the sintered body.
Figure 14:
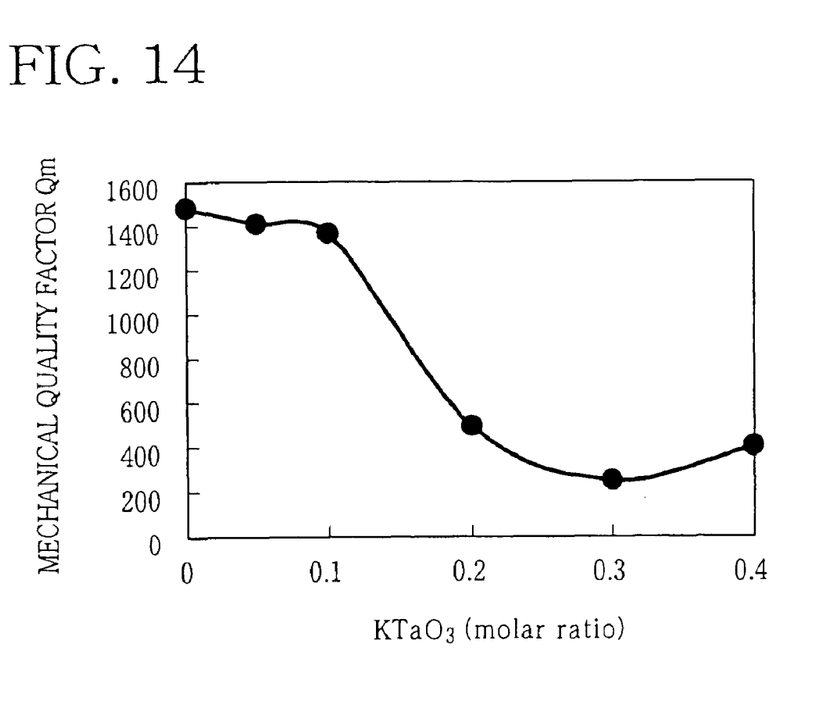
FIG. 14 is a graph indicating a relationship between the solid solution ratio of $KTaO_3$ and the mechanical quality factor of the sintered body.
Figure 15:
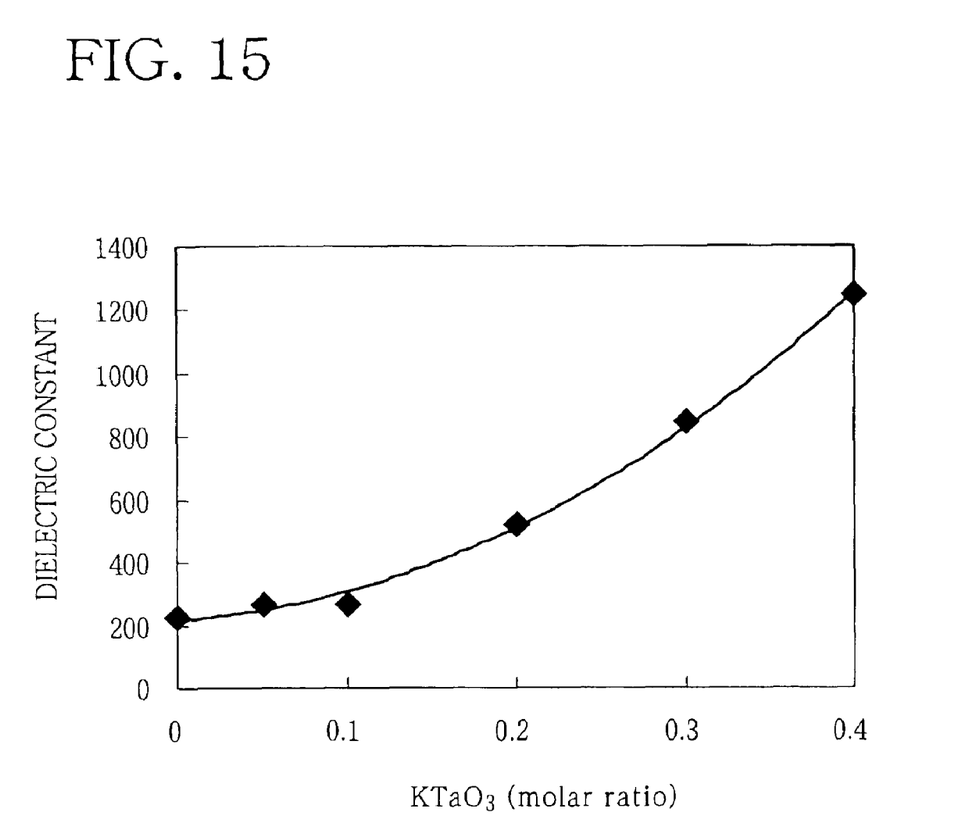
FIG. 15 is a graph indicating a relationship between the solid solution ratio of $KTaO_3$ and the dielectric constant of the sintered body.

The graphs of FIGS. 13–15 indicate the electromechanical coupling factor kp, mechanical quality factor Qm and dielectric constant which were measured when the solid solution ratio (molar ratio) of $KTaO_3$ was changed. As described above, the mere addition of CuO did not improve the dielectric constant. However, the solid solution of $KTaO_3$ was effective to increase the dielectric constant with an increase in the ratio of the solid solution. Where the amount of addition of the solid solution ratio was 0.3 molar ratio or higher, the dielectric constant was increased to a value of 1000 or higher. While the electromechanical coupling factor kp was not appreciably changed by the addition of the solid solution of $KTaO_3$, the coupling factor kp was only slightly increased with an increase of the amount of addition of the solid solution from zero to an extremely small value of 0.05 molar ratio, and was the highest at the molar ratio of 0.05. On the other hand, the mechanical quality factor Qm had a tendency of decreasing with an increase in the molar ratio of the solid solution of $KTaO_3$, but was kept at a high value of not lower than 1000 as long as the molar ratio was not higher than about 0.10. Thus, the piezoelectric ceramic composition exhibits high values of dielectric constant, electromechanical coupling factor and mechanical quality factor, when the proportion of the components of the composition is suitably adjusted.

While various examples according to one embodiment of the present invention have been described in detail by reference to the accompanying drawings, for illustrative purpose only, it is to be understood that the present invention may be otherwise embodied.

In the illustrated embodiment, the element 10 is a circular disk having a thickness of about 1 mm and a diameter of about 15 mm. However, the lead-free piezoelectric ceramic composition according to the present invention may be used to form any other body or structure having desired size and configuration, for instance, to form an element in the form of a prism or a rectangular plate.

Although the element 10 of the illustrated embodiment is adapted to be used as a ultrasonic actuator, the lead-free piezoelectric ceramic composition of the present invention may be used as any other piezoelectric ceramic element or device, such as a sensor, a filter, a transducer or resonator, and a ultrasonic motor.

In the illustrated embodiment, the starting composition consisting of a mixture of a plurality of starting materials was calcined to obtain a calcined powder of the starting composition, which was then molded by CIP into a green body, which was then fired or sintered to fabricate the element 10. However, various forming or molding techniques other than CIP (cold isostatic pressing) may be employed depending upon the specific size, shape and application of a desired piezoelectric ceramic body or structure to be fabricated.

Although the illustrated examples of lead-free piezoelectric ceramic composition are principally constituted by perovskite compounds represented by the formula (K, Na)(Nb, Ta)$O_3$, the principle of the present invention is equally applicable to various other kinds of perovskite-based piezoelectric ceramic composition, such as $(Bi_{0.5}Na_{0.5})TiO_3$-$KNbO_3$, and $(Bi_{0.5}K_{0.5})TiO_3$-$KNbO_3$, as long as the perovskite-based piezoelectric ceramic composition is principally constituted by a $KNbO_3$-based perovskite compound which is relatively hard to be sintered.

In the illustrated examples, Cu in the form of CuO is added to a perovskite compound of a non-stoichiometric composition. However, the form of Cu to be added may be modified, as desired, provided that this form of Cu does not adversely affect the piezoelectric properties of the piezoelectric ceramic composition to be obtained. For instance, Cu may be added alone, or in the form of a compound other than CuO.

In the illustrated embodiment, the starting composition used to prepare the lead-free piezoelectric ceramic composition is a mixture consisting of a first starting material in the form of a perovskite compound of a non-stoichiometric composition, and a second starting material which serves as a source of Cu to produce by-products such as $K_4CuNb_8O_{23}$ and $K_5Cu_2Nb_{11}O_{30}$. However, the starting composition may be selected so as to produce any other by-products which function to improve the sinterability of the perovskite compound and do not deteriorate (preferably, serve to improve) the piezoelectric properties of the piezoelectric ceramic composition.

It is to be understood that the present invention may be embodied with various other changes, modifications and improvements, which may occur to those skilled in the art, without departing from the spirit and scope of the invention defined in the appended claims.

What is claimed is:

1. A lead-free piezoelectric ceramic composition wherein Cu is contained in the form of a solid solution in a crystal structure or at a grain boundary of a perovskite compound of a non-stoichiometric composition represented by a formula $(K_xA_{1-x})_y(Nb_{1-z}B_z)O_3$, wherein "A" represents at least one of Na and Bi, while "B" represents at least one of Ta and Ti, and wherein $0 < x \leq 1$, $0 < y < 1$, and $0 \leq z \leq 1$.

2. The lead-free piezoelectric ceramic composition according to claim 1, wherein 0.2–1.0 at. % of Cu is contained in 100 at. % of said perovskite compound.

3. The lead-free piezoelectric ceramic composition according to claim 2, wherein at least 0.4 at. % of Cu is contained in 100 at. % of said perovskite compound.

4. The lead-free piezoelectric ceramic composition according to claim 2, wherein no more than 0.8 at. % of Cu is contained in 100 at. % of said perovskite compound.

5. The lead-free piezoelectric ceramic composition according to claim 1, wherein a value "y" in said formula is at least 0.9.

6. The lead-free piezoelectric ceramic composition according to claim 5, wherein said value "y" is less than 0.99.

7. The lead-free piezoelectric ceramic composition according to claim 1, wherein at least 0.2 at. % of Cu is contained in 100 at. % of said perovskite compound, and a value "y" in said formula of said perovskite compound is less than 0.99.

8. The lead-free piezoelectric ceramic composition according to claim 1, wherein a value "z" in said formula of said perovskite compound is no more than 0.4.

9. The lead-free piezoelectric ceramic composition according to claim 1, wherein Cu is contained in said perovskite compound, in the form of at least one of compounds $K_4CuNb_8O_{23}$, $K_5Cu_2Nb_{11}O_{30}$ and $K_{5.4}Cu_{1.3}Ta_{10}O_{29}$.

10. The lead-free piezoelectric ceramic composition according to claim 1, wherein a value "x" in said formula of said perovskite compound is equal to 0.5.

11. A process of preparing a lead-free piezoelectric ceramic composition, comprising the steps of:

preparing a starting composition including, as a primary component, a perovskite compound represented by a formula $(K_xA_{1-x})(Nb_{1-z}B_z)O_3$, wherein "A" represents at least one of Na and Bi, while "B" represents at least one of Ta and Ti, and wherein $0 < x \leq 1$, and $0 \leq z < 1$, and as a secondary component, at least one of compounds $K_4CuNb_8O_{23}$, $K_5Cu_2Nb_{11}O_{30}$ and $K_{5.4}Cu_{1.3}Ta_{10}O_{29}$; and subjecting said starting composition to a firing treatment.

12. A process of preparing a lead-free piezoelectric ceramic composition, comprising the steps of:

preparing a mixture consisting of a first starting material in the form of a perovskite compound of a non-stoichiometric composition represented by a formula $(K_xA_{1-x})_y(Nb_{1-z}B_z)O_3$, wherein "A" represents at least one of Na and Bi, while "B" represents at least one of Ta and Ti, and wherein $0 < x \leq 1$, $0 \, y \, 1$, and $0 \leq z \leq 1$, and a second starting material serving as a source of Cu; and calcining said mixture.

13. The process according to claim 12, wherein said second starting material is CuO.

14. The process according to claim 12, wherein $0.9 < y < 1$, and $0 \leq z \leq 0.4$.

* * * * *